United States Patent [19]

Feinberg et al.

[11] Patent Number: 4,553,050
[45] Date of Patent: Nov. 12, 1985

[54] TRANSMISSION LINE TERMINATOR-DECOUPLING CAPACITOR CHIP FOR OFF-CHIP DRIVER

[75] Inventors: Irving Feinberg, Poughkeepsie; Leon L. Wu, Hopewell Junction, both of N.Y.; Leo Yuan, San Jose, Calif.

[73] Assignee: International Business Machines Corporation, Armonk, N.Y.

[21] Appl. No.: 565,318

[22] Filed: Dec. 27, 1983

[51] Int. Cl.[4] .................... H03H 5/02; H03H 7/38
[52] U.S. Cl. .......................... 307/443; 307/200 A; 307/246; 307/303; 333/32; 357/51
[58] Field of Search .............. 307/200 A, 443, 543, 307/246, 247 A, 270, 303; 333/12, 32, 124, 22 R; 357/51; 361/17; 323/370

[56] References Cited

U.S. PATENT DOCUMENTS

| | | |
|---|---|---|
| 1,549,394 | 8/1925 | Tyler . |
| 2,064,841 | 12/1936 | Liebmann ................... 250/16 |
| 2,566,666 | 2/1948 | Khouri et al. ................. 323/74 |
| 3,065,358 | 11/1962 | Lee et al. ........................ 307/88 |
| 3,200,326 | 8/1965 | Pritikin et al. ................. 323/74 |
| 3,585,399 | 6/1971 | Andrews, Jr. ........... 333/124 X |
| 3,751,681 | 8/1973 | Jordan, Jr. .................... 307/215 |
| 3,751,682 | 8/1973 | Howe ............................ 307/255 |
| 3,832,575 | 8/1974 | Dasgupta et al. ............ 307/208 |
| 3,904,886 | 9/1975 | Ehling et al. .............. 333/12 X |
| 4,209,663 | 6/1980 | Sekiguchi ............... 333/124 X |
| 4,210,885 | 7/1980 | Ho ........................... 307/443 X |
| 4,228,369 | 10/1980 | Anantha et al. ............. 307/270 |
| 4,298,846 | 11/1981 | Hirano et al. .............. 357/51 X |
| 4,398,106 | 8/1983 | Davidson et al. ...... 307/200 A X |
| 4,414,480 | 11/1983 | Zasio ......................... 333/32 X |
| 4,453,153 | 6/1984 | Capek et al. .............. 333/12 X |
| 4,477,736 | 10/1984 | Onishi ...................... 307/443 X |

OTHER PUBLICATIONS

Ku et al, "Capacitor Structure for Integrated Circuit Semiconductor Devices", IBM Tech. Disc. Bull., vol. 18, No. 11, Apr. 1976, pp. 3693-3694.
Bove et al, "Impedance Terminator for AC Testing Monolithic Chips", IBM Tech. Disc. Bull., vol. 15, No. 9, Feb. 1973, pp. 2681-2682.
Abbas et al, "Bipolar Structure with Junction Capacitance Integrated within Each Cell", IBM TDB, vol. 24, No. 3, Aug. 1981, pp. 1757-1758.
Davidson et al, "Capacitor for Multichip Modules", IBM Tech. Disc. Bull., vol. 20, No. 8, Jan. 1978, pp. 3117-3118.
IBM TDB, vol. 22, No. 11, Apr. 1980, "Decoupling Capacitor Implementation Scheme", I. Feinberg, A. Platt, L. L. Wu, pp. 4919-4921.

*Primary Examiner*—Stanley D. Miller
*Assistant Examiner*—D. R. Hudspeth
*Attorney, Agent, or Firm*—Robert J. Haase

[57] ABSTRACT

A signal transmission line terminator for an off-chip driver circuit is disclosed in which each capacitor and resistor comprising each terminator are formed on the same chip separate from the driver circuit chip. The close proximity of the elements of the terminator reduce the path lengths therebetween to a minimum. The structure substantially eliminates the corresponding inductive reactance and concomitant ΔI noise at high switching rates employed in high performance computers.

5 Claims, 2 Drawing Figures

TRANSMISSION LINE TERMINATOR-DECOUPLING CAPACITOR CHIP FOR OFF-CHIP DRIVER

DESCRIPTION

1. Technical Field

This invention generally relates to signal transmission line terminators for off-chip driver circuits and, more particularly, to such terminators comprising a decoupling capacitor and resistor formed on one chip separate from the chips on which the respective receiver or driver circuits are formed.

2. Background Art

In conventional designs, the terminator resistors for off-chip driver circuits are located on the same chip with the receiver or driver circuits. Decoupling capacitors, if any, are located on the module or card on which the chips with the terminator resistors are placed. Examples of the placement of a receiver circuit or driver circuit on the same chip with terminator resistors are descibed in U.S. Pat. No. 3,832,575, for Data Bus Transmission Line Termination Circuit, issued on Aug. 27, 1974 to Sumit Dasgupta et al., and U.S. Pat. No. 4,228,369, for Integrated Circuit Interconnection Structure Having Precision Terminating Resistors, issued on Oct. 14, 1980 to Narasipur G. Anantha et al., both being assigned to the present assignee.

Although there is a saving in processing cost and other advantages may be realized in placing terminator resistors on active circuit chips having receiver and driver circuits, a switching noise ($\Delta I$) problem arises as the driver circuits are operated at the extremely high switching rates of high performance computers. The current pulses of the data signals issuing from the driver circuits encounter significant inductive reactance in traversing the distance between the terminator resistors and the power supply return line. The resulting reactive voltage transients cause substantial $\Delta I$ noise which can produce false data or errors in the functioning of the logic circuits or storage devices connected to the same return line.

The problem of supplying current of off-chip drivers operating at extremely high switching rates, which precludes obtaining current from more distant power supplies due to the inductance of the interconnecting lines, is addressed in the IBM ® Technical Disclosure Bulletin, "Decoupling Capacitor Implementation Scheme," by I. Feinberg et al., Vol. 22, No. 11, April 1980, pg. 4919. Terminator resistors and $\Delta I$ noise problems are not discussed.

Accordingly, there is a need to terminate a transmission line from an off-chip driver in such a way that extremely fast switching rates may be realized without the introduction of objectionable $\Delta I$ noise.

SUMMARY OF THE INVENTION

A signal transmission line terminator for an off-chip driver circuit comprising a resistor and a decoupling capacitor placed on one chip, separate from the driver chip, so that path inductance between the resistor and capactor is reduced to a minimum. This arrangement greatly reduces $\Delta I$ terminator noise and significantly enhances system performance, especially at the extremely high data switching rates encountered in high performance computers.

BEST MODE FOR CARRYING OUT THE INVENTION

Push-pull drivers, characterized by a plurality of voltage sources ($V_C$ and $V_T$) connected to the output elements thereof, are widely used in high performance machines. Accordingly, the preferred embodiment of the present invention will be described in the context of such a driver. To reduce power dissipation, the terminator resistor of such a driver is connected to $V_G$. $V_G$ is a voltage level between $V_C$ and $V_T$.

The switching current from a state-of-the-art push-pull driver chip flows via its terminator resistor through the power pins to the module decoupling capacitors or board decoupling capacitors, as the case may be, to the respective voltage sources $V_C$ and $V_T$. There is normally very large AC resistance between $V_{CC}$ and $V_G$ (ground) and between $V_T$ and $V_G$ (ground) for most chip circuit designs. Consequently, there is no substantial loading effect presented by the internal chip circuits to alleviate $\Delta I$ switching noise. This fact, coupled with the relatively high inductive reactance presented by the power pins through which the switching currents flow from all driver circuits, produces unacceptable $\Delta I$ noise when large numbers of driver circuits switch simultaneously. The limiting factor for the maximum acceptable number of simultaneously switching drivers has been found to be the inductance in the path between the driver circuit chip terminator resistor and the respective decoupling capacitors.

Figure 1:
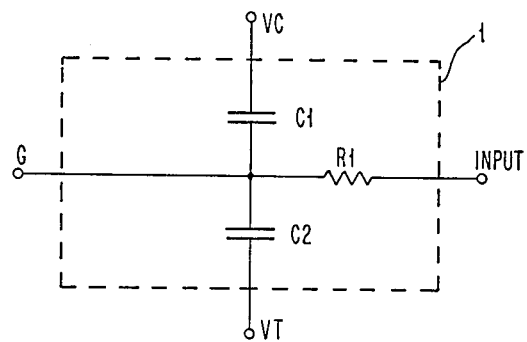
FIG. 1 is a schematic diagram of a terminator resistor and representative decoupling capacitors of the single chip configuration of the present invention.

In accordance with the present invention, the aforementioned limiting factor is removed by use of a unique decoupling capacitor-terminator resistor chip in which capacitors and resistors are merged, thereby minimizing the path inductance therebetween. The basic design is shown in FIG. 1 in which decoupling capacitors $C_1$ and $C_2$ are formed with terminator-resistor R on the same chip 1 separate from the chip (not shown) on which the push-pull driver circuit is located. The two chips normally are mounted on and connected together through a module. One terminal of each of capacitors $C_1$ and $C_2$ is connected to a respective voltage source $V_C$ and $V_T$. The other capacitor terminals are commonly connected to ground and to one terminal of resistor R1. The other terminal of resistor R is connected to the output of a respective push-pull driver circuit on a seperate chip (not shown).

Figure 2:
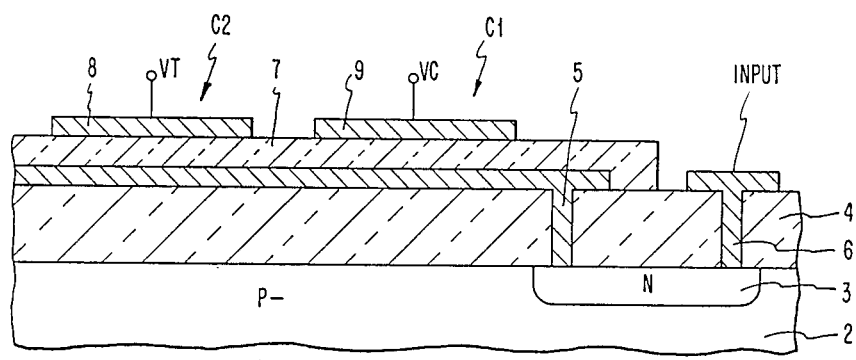
FIG. 2 is a cross-sectional view of a chip structure equivalent to the schematic diagram of FIG. 1.

A preferred embodiment of the chip structure of FIG. 1 is shown in the FIG. 2 cross-section. The same designations are used in FIG. 2 for the corresponding elements of FIG. 1. Resistor $R_1$ consists of n diffusion 3 in P−chip substrate 2. Silicon dioxide layer 4 is apertured to allow contacts 5 and 6 to opposite ends of resistor $R_1$. Contact 5 is connected to ground member G which also forms a common plate of capacitors $C_2$ and $C_1$. Additional dielectric layer 7 separates member G from the opposing plates 8 and 9 of capacitors $C_2 C_1$, respectively. Plates 8 and 9, in turn, are connected to voltage sources $V_T$ and $V_C$, respectively. Contact 6 is connected to the output of an associated push-pull driver (not shown) which also is connected to voltage sources $V_T$ and $V_C$.

It should be noted that the connections 5 between resistor $R_1$ and capacitors $C_2$ and $C_1$ is of minimal length (less than a micron) and of negligible inductive reactance at the switching speeds of high performance machines so that $\Delta I$ noise is substantially eliminated, as previously explained.

We claim:

1. A signal line terminator for a driver circuit energized by at least one source of voltage relative to ground and formed on a first semiconductor chip, said terminator comprising:

one capacitor for each said voltage source and at least one resistor formed on a second chip, said first and second chips being connected to each other, one terminal of said resistor and one terminal of each said capacitor being connected to said ground, the other terminal of said resistor being connected to said driver circuit, the other terminal of each said capacitor being connected to a respective one of said at least one voltage source, said resistor being formed of a doped region of one conductivity type in said second chip and covered by a first dielectric layer apertured to provide first and a second conductive contacts to said region, and each said capacitor being formed of a first conductive layer on the upper surface of said first dielectric layer and a respective second conductive layer spaced from said first layer by a second dielectric layer, said first conductive layer and one of said contacts being connected together and to said ground.

2. The terminator defined in claim 1 wherein said second chip is a semiconductor chip.

3. The terminator defined in claim 1 wherein said first and second chips are mounted on and connected together via a module.

4. The terminator defined in claim 1 wherein said driver circuit is a push-pull driver circuit energized by two sources of voltage.

5. The terminator defined in claim 4 wherein two capacitors are formed on said second chip.

* * * * *